United States Patent
Polinsky et al.

(10) Patent No.: US 7,273,817 B2
(45) Date of Patent: *Sep. 25, 2007

(54) CONDITIONING OF A REACTION CHAMBER

(75) Inventors: William A. Polinsky, Boise, ID (US); Bill Crane, Boise, ID (US); John C. Gonzales, Kuna, ID (US); Steven Ott, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 82 days.

This patent is subject to a terminal disclaimer.

(21) Appl. No.: 11/273,820

(22) Filed: Nov. 14, 2005

(65) Prior Publication Data

US 2006/0202394 A1 Sep. 14, 2006

Related U.S. Application Data

(63) Continuation of application No. 10/716,135, filed on Nov. 18, 2003, now Pat. No. 7,022,620.

(51) Int. Cl.
*H01L 21/461* (2006.01)

(52) U.S. Cl. .............................. 438/725; 257/E21.256
(58) Field of Classification Search ................ 438/725; 257/E21.256
See application file for complete search history.

(56) References Cited

U.S. PATENT DOCUMENTS

| 3,619,249 | A | 11/1971 | Cannon ...................... 428/336 |
| 4,397,724 | A | 8/1983 | Moran .................... 204/192.35 |
| 6,080,680 | A | 6/2000 | Lee et al. .................... 438/727 |
| 6,350,697 | B1 | 2/2002 | Richardson et al. ........ 438/710 |
| 6,776,851 | B1 | 8/2004 | Singh et al. .................. 134/26 |
| 2002/0086118 | A1 | 7/2002 | Chang et al. ............... 427/447 |

*Primary Examiner*—Evan Pert
(74) *Attorney, Agent, or Firm*—Fletcher Yoder

(57) ABSTRACT

A method is provided for forming polymer on an interior surface of a reaction chamber. A polymer-forming gas is introduced into the chamber during the etching of a photoresist layer of a semiconductor wafer within the reaction chamber and the environment is regulated to form the polymer on the interior surface of the chamber. The polymer thus formed reduces the standard deviation of the critical dimensions of the semiconductor wafer. A method for the manufacture of integrated circuits is also provided.

19 Claims, 2 Drawing Sheets

CONDITIONING OF A REACTION CHAMBER

CROSS-REFERENCE TO RELATED APPLICATIONS

This application is a continuation of U.S. Application Ser. No. 10/716,135, filed on Nov. 18, 2003, which issued on Apr. 4, 2006, as U.S. Pat. No. 7,022,620.

BACKGROUND OF THE INVENTION

1. Field of the Invention

This present invention relates generally to the field of integrated circuit manufacturing technology and, more specifically, to reducing the standard deviation of the critical dimensions of integrated circuit structures.

2. Description of the Related Art

This section is intended to introduce the reader to aspects of the art that may be related to various aspects of the present invention, which are described and/or claimed below. This discussion is believed to be helpful in providing the reader with background information to facilitate a better understanding of the various aspects of the present invention. Accordingly, it should be understood that these statements are to be read in this light, and not as admissions of prior art.

In the manufacturing of integrated circuits, numerous microelectronic circuits are simultaneously manufactured on a semiconductor substrate. These substrates are usually referred to as wafers. A typical wafer is comprised of a number of different regions, known as die regions. When fabrication is complete, the wafer is cut along these die regions to form individual dies. Each die contains at least one microelectronic circuit, which is typically replicated on each die. Examples of microelectronic circuits that may be fabricated in this manner include circuits such as dynamic random access memories and microprocessors.

Integrated circuits, such as memory devices, are typically fabricated on a wafer surface using a variety of manufacturing processes, such as layering, doping, and patterning. Layering generally refers to adding material to the surface of the wafer by a growth process, such as oxidation, or through a deposition process, such as chemical vapor deposition (CVD) or physical vapor deposition (PVD). Doping generally refers to the process of implanting dopants into the wafer surface or overlying layer and may be used to increase the current carrying capacity of a region of the wafer or overlying layer of material. The doping process may be implemented before a layer is formed, between layers, or even after the layer is formed. Generally, the doping process may be accomplished through an ion implantation process or through thermal diffusion, for example.

Patterning refers to a series of steps that result in the removal of selected portions of layers or underlying wafer material. After removal of the selected portions of the one or more layers via a wet or dry etch process, a pattern is left on the wafer surface. The removal of material allows the structure of the device to be formed by providing holes or windows between layers or by removing unwanted layers. Patterning sets the critical dimensions of the integrated circuit structures being fabricated. Critical dimensions of an integrated circuit include the widths of the lines and spaces of circuit patterns in addition to the area of the contacts. These critical dimensions govern the electrical characteristics of the integrated circuit. Disadvantageously, errors in the patterning and removal process may affect the critical dimensions of the integrated circuit, and may result in changes and failures in the electrical characteristics in the device.

One commonly used patterning technique is photolithography. One of the objectives of photolithography is to transfer a well-defined pattern to the surface of a wafer with minimal ambiguities or anomalies. In using photolithography, a pattern may be formed by using a photomask to expose certain regions of a radiation sensitive material, typically referred to as photoresist, to a certain wavelength of light. Typically, the radiation source provides UV light to pattern the photoresist. However, certain photoresists may also be implemented using other energy types, such as X-rays. Exposure to the radiation changes the structure of the photoresist. If the photoresist is a negative photoresist, then the photoresist becomes polymerized where it is exposed. If the photoresist is a positive photoresist, the exposed region of photoresist becomes divided or softened. After the exposure to the radiation, the unpolymerized regions may be dissolved by applying an appropriate solvent or it may be removed through a plasma etch process.

To enhance the photolithographic process, a bottom anti-reflective coating (BARC) layer may be implemented underneath the photoresist. The BARC layer absorbs the radiation generated by the source, thereby reducing development of the photoresist caused by reflections from underlying layers. By providing an underlying layer for absorbing the radiation, the patterned structure, which may partially determine the critical dimensions of one or more integrated circuits, is typically more defined with fewer defects as compared to methods wherein a BARC layer is not used. Once the photoresist has been patterned, the photoresist layer may be removed to allow the underlying structure to be processed. While it may be desirable to retain the BARC layer, it is typically desirable to remove the BARC layer through an etching process.

After patterning of the photoresist layer, various etchants may be selected to implement the removal of selected portions of material from the surface of the structure. Selectivity relates to the preservation of the surface underlying the etched material layer. The selectivity is generally expressed as a ratio of the etch rate of the material layer to the etch rate of the underlying surface. Further, selectivity may be used to refer to the removal rate of the photoresist with respect to the etched material layer. As can be appreciated, as the material layer is being etched through the openings patterned in the photoresist, some of the photoresist may also be removed. The removal of this photoresist during the etching procedure results in a less defined pattern in the etched layer, often increasing the critical dimensions of the integrated circuit. Accordingly, to minimize disadvantageous effects, the selectivity should be high enough to ensure that a substantial portion of the photoresist layer is not removed before the desired pattern is etched in the material layer.

As batches of semiconductor wafers are processed, the standard deviation of the critical dimensions of the features patterned on the semiconductor wafers may increase. This variance in the critical dimensions of the integrated circuits formed on semiconductor wafers is also referred to as critical dimension drift. As mentioned previously, integrated circuits have electrical properties that vary according to the critical dimensions. Therefore, it is important to keep these critical dimensions stable for as long as possible to achieve consistency in the electrical properties of the integrated circuits from batch to batch.

BRIEF DESCRIPTION OF THE DRAWINGS

Advantages of the invention may become apparent upon reading the following detailed description and upon reference to the drawings in which.

DETAILED DESCRIPTION OF SPECIFIC EMBODIMENTS

One or more specific embodiments of the present invention will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Through comparison of various processing techniques, it has been found that the presence of polymer in a reactor chamber in which semiconductor wafers are processed stabilizes the critical dimensions of the features patterned on the semiconductor wafers. This stabilization effect results in the reduction of the standard deviation of the critical dimensions of the features formed on the semiconductor wafers and consequently provides greater consistency in the processing of these semiconductor wafers. A polymer-forming gas may be introduced within the reaction chamber to form the beneficial polymer. This polymer-forming gas may be advantageously provided within the chamber either during processing of a semiconductor wafer within the chamber or before a semiconductor wafer is disposed within the chamber.

Figure 1:
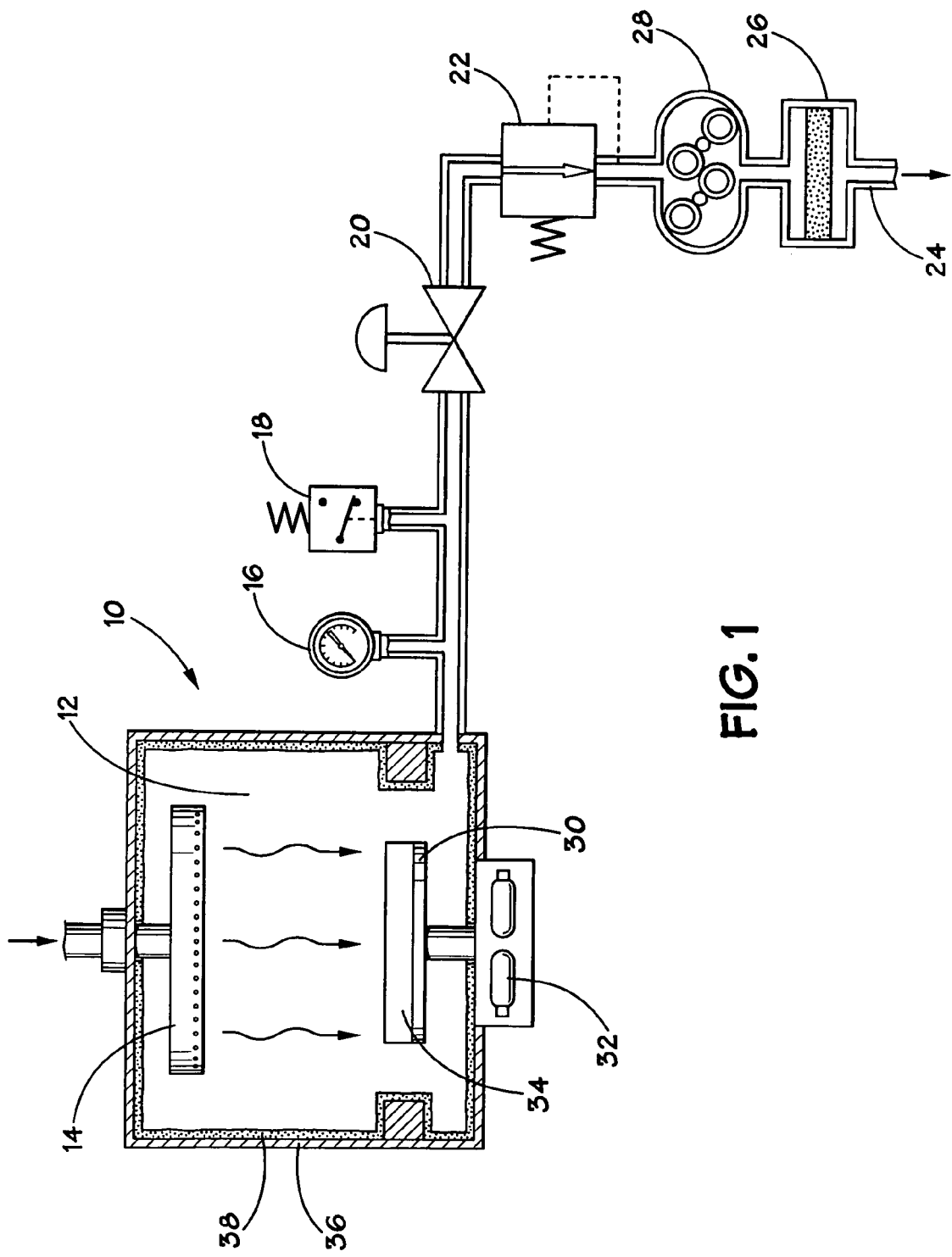
FIG. 1 illustrates an exemplary reactor in which a polymeric layer may be formed in accordance with the present techniques.

In processing a semiconductor wafer, an exemplary reactor 10 is advantageously used, as illustrated in FIG. 1. During the processing of the semiconductor wafer, a desired polymer-forming gas may be introduced into the reaction chamber 12 through a showerhead 14. The reaction chamber 12 may be a deposition chamber, an etching chamber, or any other chamber in which gases may be introduced. In addition to polymer-forming gases, other gases may be introduced into reaction chamber 12 if desired, such as reactant gases and carrier gases. The gases may or may not be mixed prior to introduction into the reaction chamber 12. The gases are generally introduced through the showerhead 14 to achieve good dispersion of the gases, but the gases can be introduced by other means as would be apparent to one of ordinary skill in the art.

Desired reaction pressures may be maintained by conventional pressure control components, including, for example, a pressure sensor 16, a pressure switch 18, an air operating vacuum valve 20, and a pressure control valve 22. The carrier gas and the byproduct gas given off during the reaction escape from the reaction chamber 12 through an exhaust vent 24. These gases typically pass through a particulate filter 26. A roots blower 28 may be employed to facilitate gas removal.

The processing of a semiconductor wafer 34 may include steps in which heating the semiconductor wafer 34 is beneficial. Therefore, the exemplary reactor 10 may include a substrate holder 30, which may be heated in some fashion, such as by halogen lamps 32, to facilitate processing of the semiconductor wafer 34. Plasma may also be introduced into the reaction chamber 12 during processing. For instance, plasma may be introduced to enhance certain deposition reactions or for etching layers disposed on semiconductor wafer 34.

Prior to and/or during processing of the wafer 34, a layer of polymer 38 may be disposed on an interior surface 36 of the reaction chamber 12. The polymer 38 may be formed on the interior surface 36 by introducing a polymer-forming gas within the reaction chamber 12 and regulating the environment therein to enable polymerization to occur. The environment within the reaction chamber 12 may be adjusted in various ways, such as by altering the temperature and/or pressure within the reaction chamber 12. In forming the polymer 38, any polymer-building gas may be used, such as difluoromethane ($CH_2F_2$), trifluoromethane ($CHF_3$), octofluorocyclobutane ($C_4F_8$), and hexafluoro-13 butadiene ($C_4F_6$). As would be understood by one skilled in the art, these gases are listed for demonstrative purposes only, and are not exhaustive of the gases suitable for building polymer within the reaction chamber 12 in accordance with the present technique. Further, the resulting polymer 38 deposited on the interior surface 36 of the reaction chamber 12 may be any suitable type of polymer formed from a polymer-forming gas.

Figure 2:
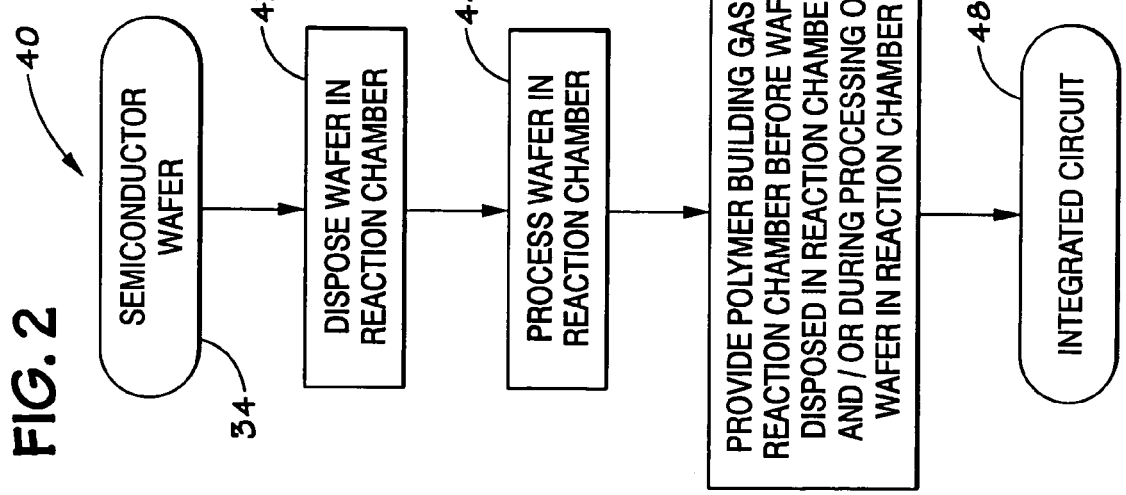
FIG. 2 is a flow chart representing an exemplary process for manufacturing an integrated circuit in accordance with the present techniques.

A flow chart providing exemplary steps in a method of manufacturing an integrated circuit 48 in accordance with the present technique is provided in FIG. 2, the process being generally designated by reference numeral 40. A semiconductor wafer 34 is disposed within the reaction chamber 12. (Block 42). The semiconductor wafer 34 within the reaction chamber 12 is processed in the presence of the polymer 38. (Block 44). Processing may include one or more of layering, imaging, etching, doping, heating, and cleaning the semiconductor wafer 34. For instance, an exemplary semiconductor wafer 34 disposed within the reaction chamber 12 may include a plurality of layers, such as a bottom anti-reflective coating layer, an oxide layer, and a photoresist layer. Processing of this exemplary semiconductor wafer 34 may include etching one or more of these layers of the semiconductor wafer 34. The various layers may be wet etched, using one or more appropriate solutions, or dry etched using plasma. While processing of a semiconductor wafer 34 within a reaction chamber 12 may include numerous steps or processes, it may also be as simple as performing one step, such as depositing a layer of material or etching a single layer of the semiconductor wafer 34.

A polymer-building gas may be introduced within the reaction chamber 12 prior to and/or during wafer processing. (Block 46). The polymer-building gas may be introduced into reaction chamber 12 in a relatively small ratio as compared with the reactant gas. For example, the polymer-building gas $C_4F_6$ may be introduced in the range of about 20-100 sccm, as compared to about 1000 sccm for oxygen. The polymer-building gas may be provided at any temperature suitable for deposition, such as in a temperature range between about 90° C. and 250° C.

Also, the polymer-building gas may be provided within the reaction chamber 12 prior to disposal of the semiconductor wafer 34 in the reaction chamber 12 (see Block 42), or during processing of the semiconductor wafer 34 (see Block 44). For example, in processing the exemplary semiconductor wafer 34 previously discussed, which may include a bottom anti-reflective coating layer, an oxide layer, and a photoresist layer, the polymer-forming gas may advantageously be provided during the photoresist etch step to enhance the rate at which the photoresist layer is etched and to avoid possible interference with any subsequent steps.

It should be understood that the polymer-forming gas need not be provided immediately preceding or during the processing of each semiconductor wafer 34. Once a polymer-building gas is provided and the polymer 38 is formed on the interior surface 36 of the reaction chamber 12, multiple semiconductor wafers 34 may be processed in accordance with this technique while some amount of the polymer 38 remains on the interior surface 36. However, the polymer 38 within the reaction chamber 12 may gradually decrease from the processing of semiconductor wafers 34. In such an instance, a polymer-forming gas may be provided periodically to replenish the polymer 38 on the interior surface 36 of the reaction chamber 12.

The processing of semiconductor wafers 34 in reaction chambers 12 may result in other materials forming on interior surfaces 38 of the reaction chamber 12. These materials may negatively impact the processing of semiconductor wafers 34, necessitating periodic cleaning of these reaction chambers 12. The methods used to clean these reaction chambers 12 may also remove the beneficial polymer 38. Accordingly, after the cleaning of the reaction chamber 12, a polymer-building gas may be advantageously provided within the reaction chamber 12 prior to the processing of semiconductor wafers 34 to build an initial layer of polymer 38 on an interior surface 38 of the reaction chamber 12.

Figure 3:
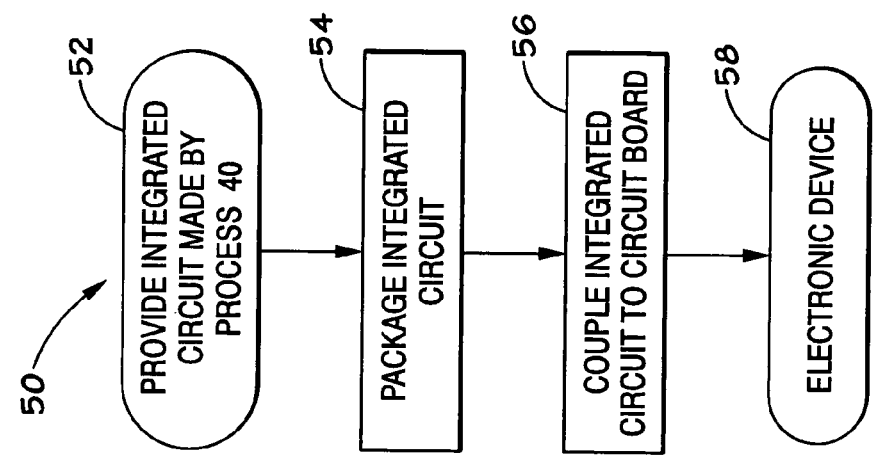
FIG. 3 is a flow chart representing an exemplary process for manufacturing an electronic device in accordance with the present techniques.

It should be appreciated that integrated circuits manufactured by the techniques described above are typically incorporated into an electronic device and/or an electronic system. Accordingly, a method of manufacturing an electronic device 58, the method generally designated by reference numeral 50, is depicted in FIG. 3 in the form of a flow chart. Initially, an integrated circuit 48 made by the process 40 is provided. (Block 52). The integrated circuit 48 is typically packaged. (Block 54). The package of an integrated circuit 48 may serve a variety of functions, such as protecting the integrated circuit 48, providing a means for thermal dissipation, and/or providing an electrical lead system. The packaging of the integrated circuit 48 may be achieved through a variety of means known in the art. For example, packaging the integrated circuit 48 may include electrically connecting the integrated circuit 48 to a lead system and then encapsulating the integrated circuit 48 within an enclosure, such as an epoxy, a polyimide, or a ceramic material.

The method 50 also provides for the coupling of the integrated circuit 48 to a substrate, such as a circuit board. (Block 56). The integrated circuit 48 will typically be coupled in step 56 to a circuit board subsequent to the packaging of step 54 due to the small size of electrical leads of the integrated circuit 48. However, the integrated circuit 48 may instead be coupled to the circuit board and then packaged by some means, such as a molding process. The method 50 may also include other steps that may be performed prior to, during, between, or subsequent to the steps provided, ultimately resulting in the electronic device 58.

An exemplary electronic device 58 may include a single memory device such as Dynamic Random Access Memory (DRAM), Double Data Rate (DDR) memory, and/or Static Random Access Memory (SRAM), or may include a memory module having a plurality of memory devices capable of storing data, such as a single-inline memory module (SIMM) or a dual-inline memory module (DIMM). Generally, a memory controller is provided to facilitate access to the storage devices. This memory controller may be a chip on the memory module, or may be in a separate processor or chip remote from the memory module, as can be appreciated by those skilled in the art. The memory controller may receive requests to access the memory devices via one or more processors, peripheral devices, and/or other systems. The memory controller is generally tasked with facilitating the execution of the requests to the memory devices and coordinating the exchange of information, including configuration information, to and from the memory devices. Although the exemplary electronic device 58 includes a memory device, the electronic device 58 may alternatively include some other device, such as a computer motherboard, or a component for an electronic system.

Figure 4:
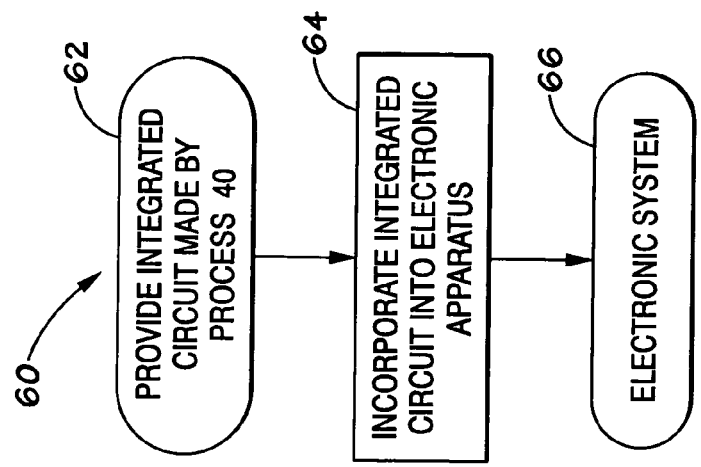
FIG. 4 is a flow chart representing an exemplary process for manufacturing an electronic system in accordance with the present techniques.

Integrated circuits 48 may found in any number of electronic systems, including processor-based systems. A flow chart depicting exemplary steps in manufacturing an electronic system 66 is illustrated in FIG. 4, the method being generally designated by reference numeral 60. The method 60 includes providing an integrated circuit 48 produced by the process 40 and incorporating the integrated circuit 48 into an electronic apparatus (Blocks 62 and 64). The method 60 may include additional steps that may be performed to complete manufacture of an electronic system 66.

An exemplary electronic system 66 may be any of a variety of types of processor-based devices, such as a computer, pager, cellular phone, personal organizer, control circuit, etc. In a typical processor-based device, a processor, such as a microprocessor, controls the processing of system functions and requests in the electronic system 66. Further, the processor may include a plurality of processors that share system control. Such a processor-based system typically includes a power supply, which may advantageously include permanent batteries, replaceable batteries, rechargeable batteries, an AC adapter, and/or a DC adapter.

Various other peripheral devices may be coupled to the electronic system 66 depending on the functions that the exemplary system 66 performs. For instance, a user interface may be coupled to the electronic system 66. The user interface may include buttons, switches, a keyboard, a light pen, a joystick, a mouse, a number pad, and/or a voice recognition system, for instance. A display may also be coupled to the electronic system 66. The display may include an LCD display, a CRT, LEDs, and/or an audio display, for example. Furthermore, an RF sub-system/baseband processor may also be coupled to the electronic system 66. The RF sub-system/baseband processor may include an antenna that is coupled to an RF receiver and to an RF transmitter. A communications port may also be coupled to the electronic system 66. The communications port may be adapted to be coupled to one or more additional peripheral devices such as a modem, a printer, a computer, or to a network, such as a local area network, remote area network, intranet, or the Internet, for instance.

While the invention may be susceptible to various modifications and alternative forms, specific embodiments have been shown by way of example in the drawings and will be described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method for forming polymer within a reaction chamber, the process comprising:
   providing a reaction chamber;
   introducing a polymer-forming gas within the reaction chamber concurrent with etching of a photoresist layer of a first semiconductor wafer in the reaction chamber; and
   regulating an environment within the reaction chamber to form a polymer on an interior surface of the reaction chamber, wherein the polymer reduces the standard deviation of the critical dimensions of the first semiconductor wafer;
   removing the first semiconductor wafer from the reaction chamber;
   inserting a second semiconductor wafer into the reaction chamber; and
   etching the second semiconductor wafer, wherein the polymer reduces the standard deviation of the critical dimensions of the second semiconductor wafer.

2. The method of claim 1, wherein the provided polymer-building gas comprises at least one of:
   difluoromethane;
   trifluoromethane;
   octofluorocyclobutane;
   hexafluoro-13 butadiene; or
   any combination thereof.

3. The method of claim 1, wherein etching the second semiconductor wafer is performed without adding additional polymer-forming gas to the reaction chamber.

4. The method of claim 1, wherein no additional polymer-forming gas is introduced within the reaction chamber while the first semiconductor wafer is present within the reaction chamber.

5. The method of claim 1, comprising:
   introducing additional polymer-forming gas within the reaction chamber; and
   regulating the environment within the reaction chamber to form additional polymer on the interior surface of the reaction chamber.

6. The method of claim 5, wherein the additional polymer-forming gas is introduced within the reaction chamber while no semiconductor wafers are present within the reaction chamber.

7. A method of manufacturing an integrated circuit, the method comprising the acts of:
   disposing a first semiconductor wafer having a plurality of layers in a reaction chamber, the reaction chamber having a layer of polymer on an interior portion of the reaction chamber, wherein the polymer reduces the standard deviation of the critical dimensions of the first semiconductor wafer;
   processing the first semiconductor wafer in the reaction chamber, the processing including etching a photoresist layer of the first semiconductor wafer; and
   providing a polymer-building gas in the reaction chamber during the etching of the photoresist layer of the first semiconductor wafer to replenish the layer of polymer on the interior portion of the reaction chamber.

8. The method of claim 7, wherein the polymer-building gas is provided in a relatively small ratio as compared with a reactant gas.

9. The method of claim 7, wherein at least one layer of the first semiconductor wafer was formed through deposition.

10. The method of claim 7, wherein processing the first semiconductor wafer in the reaction chamber comprises layering the first semiconductor wafer.

11. The method of claim 10, wherein layering the first semiconductor wafer comprises at least one of:
    depositing material on the first semiconductor wafer;
    growing material on the first semiconductor wafer; or
    any combination thereof.

12. The method of claim 7, wherein etching the photoresist layer of the first semiconductor wafer comprises plasma etching of the photoresist layer.

13. The method of claim 7, comprising:
    removing the first semiconductor wafer from the reaction chamber;
    inserting a second semiconductor wafer into the reaction chamber; and
    etching the second semiconductor wafer without adding additional polymer-building gas to the reaction chamber, wherein the polymer on the interior surface of the reaction chamber reduces the standard deviation of the critical dimensions of the second semiconductor wafer.

14. The method of claim 7, wherein no polymer-building gas is provided within the reaction chamber during processing of the first semiconductor wafer within the reaction chamber other than the polymer-building gas provided during the photoresist layer etching.

15. The method of claim 7, wherein the polymer-building gas enhances the rate at which the photoresist layer is etched.

16. A method of manufacturing an electronic device, the method comprising:
    providing an integrated circuit manufactured by a process comprising:
    disposing a first semiconductor wafer in a reaction chamber;
    processing the first semiconductor wafer in the reaction chamber; and
    providing a polymer-building gas in the reaction chamber during etching of a photoresist layer of the first semiconductor wafer to create a layer of polymer on an interior portion of the reaction chamber, wherein the polymer reduces the standard deviation of the critical dimensions of the first semiconductor wafer;
    packaging the integrated circuit; and
    electrically coupling the integrated circuit to a substrate.

17. The method of claim 16, wherein a plurality of integrated circuits are electrically coupled to the substrate.

18. The method of claim 16, wherein the electronic device comprises a memory device.

19. The method of claim 16, wherein the integrated circuit manufacturing process comprises:
    removing the first semiconductor wafer from the reaction chamber;
    inserting a second semiconductor wafer into the reaction chamber; and
    etching the second semiconductor wafer without adding additional polymer-building gas to the reaction chamber, wherein the polymer on the interior surface of the reaction chamber reduces the standard deviation of the critical dimensions of the second semiconductor wafer.

* * * * *